(12) United States Patent
Minamoto et al.

(10) Patent No.: US 12,193,225 B2
(45) Date of Patent: Jan. 7, 2025

(54) SEMICONDUCTOR DEVICE

(71) Applicant: Kioxia Corporation, Tokyo (JP)

(72) Inventors: Takatoshi Minamoto, Kamakura Kanagawa (JP); Sho Tokairin, Hiratsuka Kanagawa (JP); Yoshinao Suzuki, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 644 days.

(21) Appl. No.: 17/369,453

(22) Filed: Jul. 7, 2021

(65) Prior Publication Data

US 2022/0223611 A1 Jul. 14, 2022

(30) Foreign Application Priority Data

Jan. 12, 2021 (JP) ................. 2021-003038

(51) Int. Cl.
*H01L 27/11556* (2017.01)
*G11C 5/02* (2006.01)
*H10B 41/27* (2023.01)
*H10B 43/27* (2023.01)

(52) U.S. Cl.
CPC ............. *H10B 41/27* (2023.02); *G11C 5/025* (2013.01); *H10B 43/27* (2023.02)

(58) Field of Classification Search
CPC ........ H10B 41/27; H10B 43/27; H10B 43/10; H10B 43/50; H10B 43/40; H10B 41/40; H10B 80/00; H10B 43/35; H10B 20/60; G11C 5/025; G11C 5/147; G11C 5/148; G11C 16/30; H01L 28/20–26; H01L 27/0629; H01L 27/0738
See application file for complete search history.

(56) References Cited

U.S. PATENT DOCUMENTS

| | | | |
|---|---|---|---|
| 5,524,036 A | 6/1996 | Miwada | |
| 2002/0028541 A1* | 3/2002 | Lee | H10B 69/00 438/149 |
| 2011/0233669 A1* | 9/2011 | Harada | H01L 29/7838 257/335 |
| 2012/0262200 A1* | 10/2012 | Shin | H03K 19/017545 326/30 |
| 2016/0079164 A1 | 3/2016 | Fukuzumi et al. | |
| 2016/0099283 A1 | 4/2016 | Khaliullin | |
| 2017/0179154 A1* | 6/2017 | Furihata | H10B 41/41 |
| 2018/0212604 A1 | 7/2018 | Matsubara | |

FOREIGN PATENT DOCUMENTS

| | | |
|---|---|---|
| JP | 2016-062901 A | 4/2016 |
| TW | 201618293 A | 5/2016 |

* cited by examiner

*Primary Examiner* — Cuong B Nguyen
(74) *Attorney, Agent, or Firm* — Foley & Lardner LLP

(57) ABSTRACT

A semiconductor device has a first conductivity type semiconductor substrate. A second conductivity type first impurity diffusion layer is disposed in a surface region of the semiconductor substrate. A resistance element is configured with a first conductivity type second impurity diffusion layer disposed in the first impurity diffusion layer in the surface region of the semiconductor substrate. In a transistor, a gate is connected to an input portion of the resistance element, a source is connected to the first impurity diffusion layer, and a drain is connected to a voltage source higher than the voltage of the input portion. A current source is connected to the source.

15 Claims, 8 Drawing Sheets

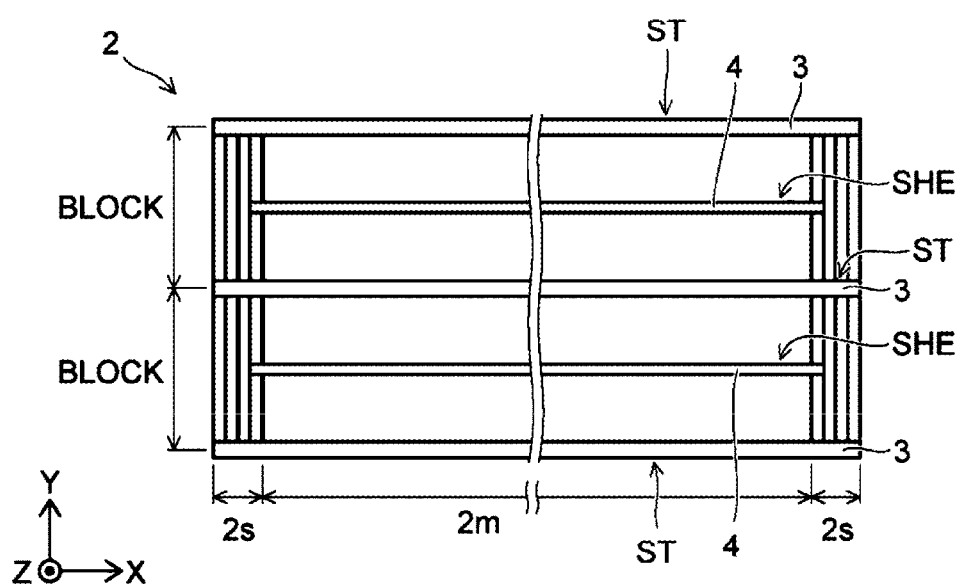

SEMICONDUCTOR DEVICE

CROSS-REFERENCE TO RELATED APPLICATION

This application is based upon and claims the benefit of priority from Japanese Patent Application No. 2021-003038, filed on Jan. 12, 2021, the entire contents of which are incorporated herein by reference.

FIELD

Embodiments described herein relate generally to a semiconductor device.

BACKGROUND

A semiconductor device such as a NAND flash memory may have a structure in which a memory cell array is provided above a complementary metal oxide semiconductor (CMOS) circuit for miniaturization. The CMOS circuit may have a voltage divider circuit including an impurity diffusion layer in a power supply circuit.

However, when a forward bias is applied between the impurity diffusion layer and a substrate due to a change in the input voltage of a resistance element of the voltage divider circuit, there is a risk that a desired output voltage may not be obtained from the voltage divider circuit. In this case, a deterioration in the reliability of the CMOS circuit may occur.

Examples of related art include JP-A-2016-062901.

DESCRIPTION OF THE DRAWINGS

FIG. 1B is a schematic plan view illustrating a stacked body.

DETAILED DESCRIPTION

Figure 1A:
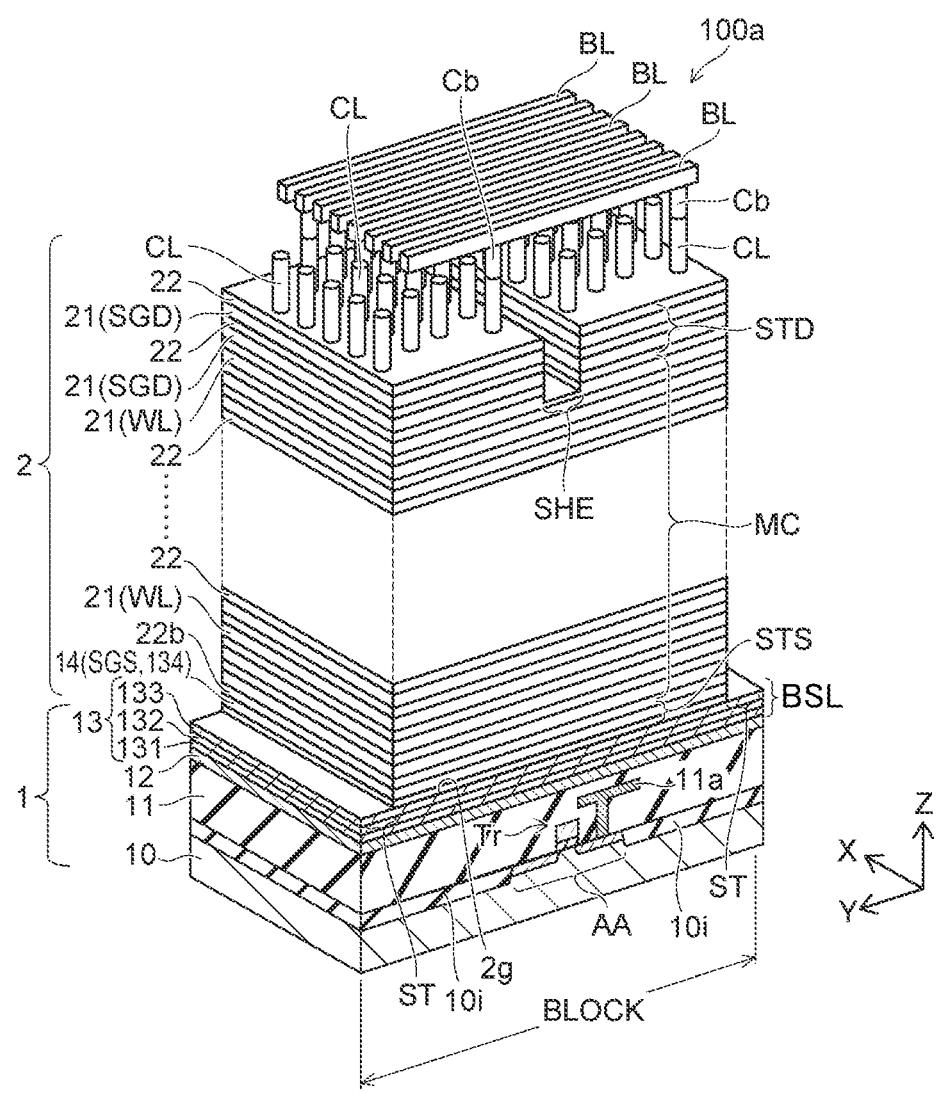
FIG. 1A is a schematic perspective view illustrating a semiconductor storage device according to a first embodiment.

At least one embodiment provides a highly reliable semiconductor device capable of obtaining a desired voltage from a voltage divider circuit.

In general, according to at least one embodiment, a semiconductor device has a first conductivity type semiconductor substrate. A second conductivity type first impurity diffusion layer is disposed in a surface region of the semiconductor substrate. A resistance element includes a first conductivity type second impurity diffusion layer disposed in the first impurity diffusion layer in the surface region of the semiconductor substrate. A transistor includes a gate connected to an input portion of the resistance element, a source connected to the first impurity diffusion layer, and a drain connected to a voltage source, the voltage source having a voltage higher than a voltage of the input portion. A current source is connected to the source.

Hereinafter, embodiments according to the present disclosure will be described with reference to the drawings. The embodiments are not intended to limit the present disclosure. The drawings are schematic or conceptual, and the ratio of each part is not always the same as an actual one. In the specification and the drawings, the same elements as those described above with respect to the previous drawings will be designated by the same reference numerals, and the detailed descriptions thereof will be omitted as appropriate.

First Embodiment

Figure 2A:
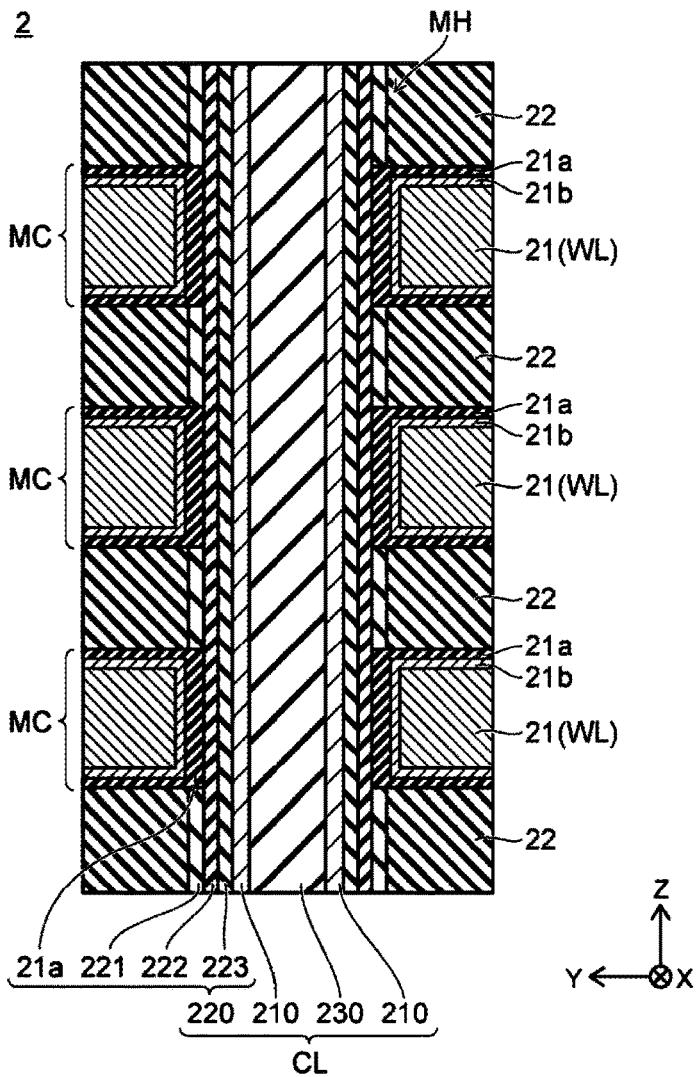
FIG. 2A is a schematic cross-sectional view illustrating a memory cell of a three-dimensional structure.
Figure 2B:
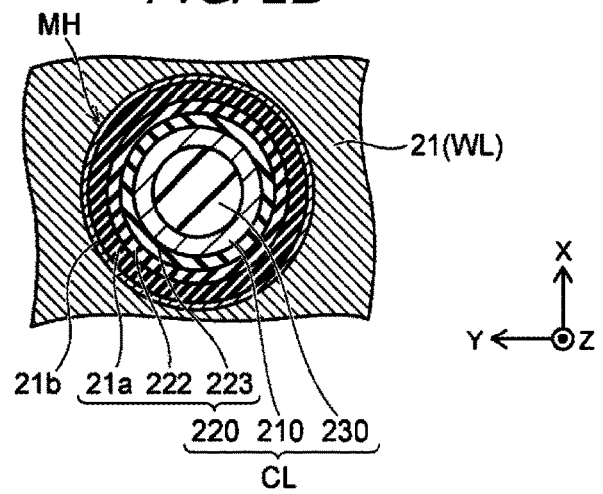
FIG. 2B is a schematic cross-sectional view illustrating the memory cell of a three-dimensional structure.
Figure 3:
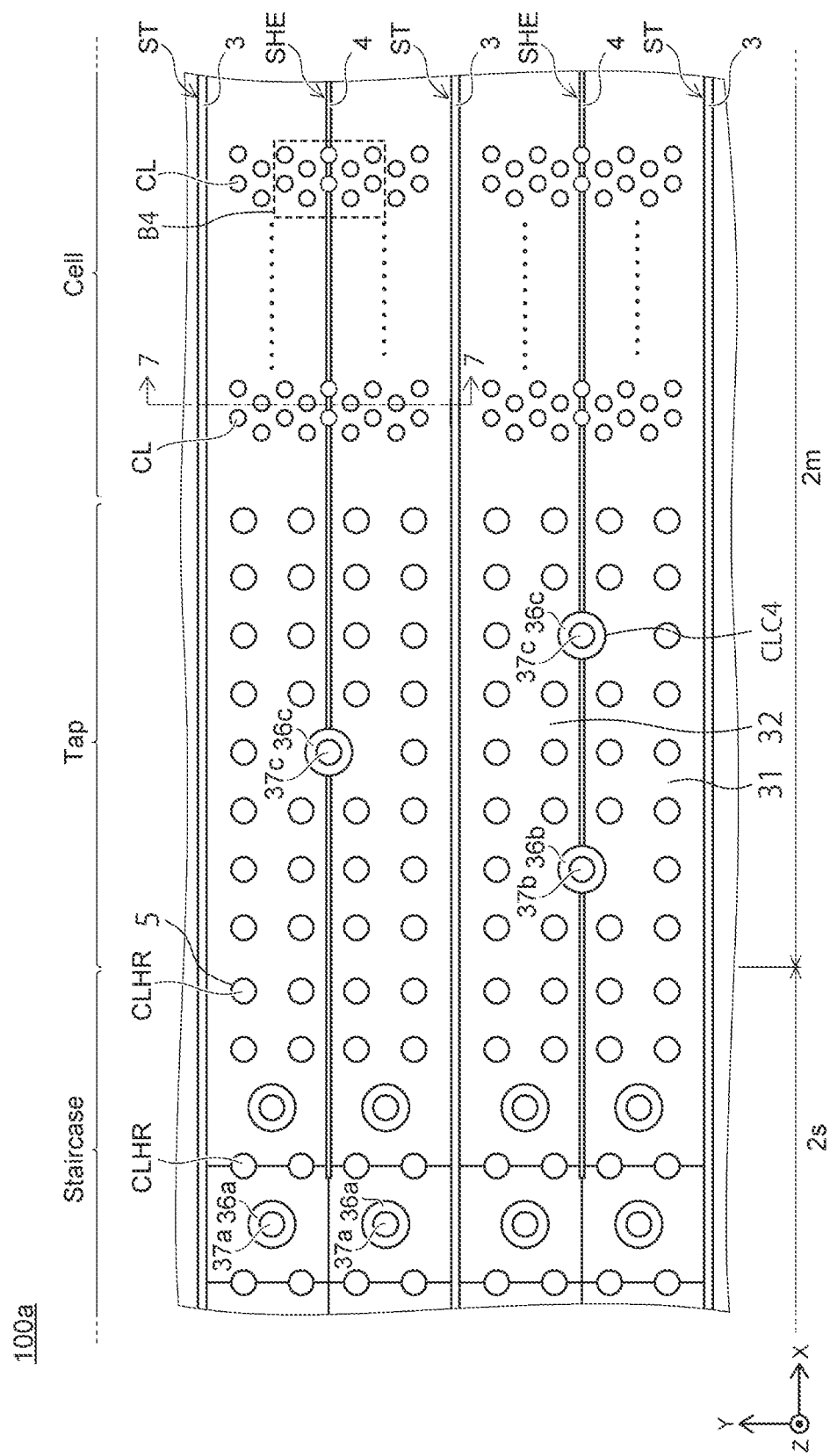
FIG. 3 is a schematic plan view illustrating a semiconductor storage device according to the first embodiment.

FIG. 1A is a schematic perspective view illustrating a semiconductor storage device 100a according to a first embodiment. FIG. 1B is a schematic plan view illustrating a stacked body 2. In the present specification, the direction in which the stacked body 2 is stacked is the Z direction. One direction that intersects with, e.g., is orthogonal to the Z direction is referred to as the Y direction. One direction that intersects with, e.g., is orthogonal to each of the Z and Y directions is referred to as the X direction. FIGS. 2A and 2B are respectively schematic cross-sectional views illustrating a memory cell of a three-dimensional structure. FIG. 3 is a schematic plan view illustrating the semiconductor storage device 100a according to the first embodiment.

As illustrated in FIGS. 1A to 3, the semiconductor storage device 100a according to the first embodiment may be a non-volatile memory having a memory cell of a three-dimensional structure. However, the embodiments may also be applied to semiconductor devices other than semiconductor storage device.

The semiconductor storage device 100a includes a base unit 1, a stacked body 2, a deep slit ST (plate-shaped portion 3), a shallow slit SHE (plate-shaped portion 4), and a plurality of columnar portions CL.

The base unit 1 includes a substrate 10, an interlayer insulating film 11, a conductive layer 12, and a semiconductor portion 13. The interlayer insulating film 11 is provided on the substrate 10. The conductive layer 12 is provided on the interlayer insulating film 11. The semiconductor portion 13 is provided on the conductive layer 12.

The substrate 10 is a semiconductor substrate, for example, a silicon substrate. The conductivity type of silicon (Si) is, for example, a p type. For example, a device isolating region 10i is provided in the surface region of the substrate 10. The device isolating region 10i is, for example, an insulating region containing a silicon oxide, and partitions an active area AA in the surface region of the substrate 10. The active area AA is provided with source and drain regions of a transistor Tr. The transistor Tr constitutes a peripheral circuit (complementary metal oxide semiconductor (CMOS) circuit) of the non-volatile memory. The CMOS circuit is provided below an embedded source layer BSL, and is provided on the substrate 10. The interlayer insulating film 11 contains, for example, a silicon oxide ($SiO_2$), and insulates the transistor Tr. A wiring 11a is provided in the interlayer insulating film 11. The wiring 11a is a wiring electrically connected to the transistor Tr. The conductive layer 12 contains a conductive metal such as tungsten (W). The semiconductor portion 13 contains, for example, silicon. The conductivity type of silicon is, for example, an n type. A portion of the semiconductor portion 13 may contain undoped silicon.

The conductive layer 12 and the semiconductor portion 13 are electrically connected to each other as an integral first conductive film, and function as a common source electrode (embedded source layer) of a memory cell array (2m in FIGS. 2A and 2B). Thus, the conductive layer 12 and/or the semiconductor portion 13 are also called the embedded source layer BSL.

The stacked body 2 is provided above the substrate 10, and is located in the Z direction with respect to the conductive layer 12 and the semiconductor portion 13 (embedded source layer BSL). The stacked body 2 is formed by alternately stacking a plurality of electrode films 21 and a plurality of insulating layers 22 along the Z direction. The electrode films 21 contain a conductive metal such as tungsten. The insulating layers 22 contain, for example, a silicon oxide. The insulating layers 22 insulate the electrode films 21 from each other. The number of each of the electrode films 21 and the insulating layers 22 stacked may be freely selected. The insulating layers 22 may be, for example, air gaps. For example, an insulating film 2g is provided between the stacked body 2 and the semiconductor portion 13. The insulating film 2g contains, for example, a silicon oxide ($SiO_2$). The insulating film 2g may contain a high dielectric substance having a higher relative dielectric constant than a silicon oxide. The high dielectric substance is, for example, a metal oxide.

The electrode films 21 include at least one source-side select gate SGS, a plurality of word line WLs, and at least one drain-side select gate SGD. The source-side select gate SGS is a gate electrode of a source-side select transistor STS. The word lines WL are gate electrodes of memory cells MC. The drain-side select gate SGD is a gate electrode of a drain-side select transistor STD. The source-side select gate SGS is provided in the lower region of the stacked body 2. The drain-side select gate SGD is provided in the upper region of the stacked body 2. The lower region refers to a region of the stacked body 2 on the side closer to the base unit 1, and the upper region refers to a region of the stacked body 2 on the side far away from the base unit 1. The word lines WL are provided between the source-side select gate SGS and the drain-side select gate SGD.

Among the plurality of insulating layers 22, the thickness in the Z direction of the insulating layer 22 that insulates the source-side select gate SGS and the word wire WL from each other may be, for example, thicker than the thickness in the Z direction of the insulating layer 22 that insulates the word wire WL and the word wire WL from each other. Furthermore, a cover insulating film (not illustrated) may be provided on the uppermost insulating layer 22 farthest from the base unit 1. The cover insulating film contains, for example, a silicon oxide.

The semiconductor storage device 100a has a plurality of memory cells MC connected in series between the source-side select transistor STS and the drain-side select transistor STD. A structure in which the source-side select transistor STS, the memory cells MC, and the drain-side select transistor STD are connected in series is called a "memory string" or a "NAND string". The memory string is connected to a bit line BL via, for example, a contact Cb. The bit line BL is provided above the stacked body 2, and extends in the Y direction.

A plurality of deep slits ST and a plurality of shallow slits SHE are provided respectively in the stacked body 2. The deep slit ST extends in the X direction, and is provided in the stacked body 2 so as to penetrate the stacked body 2 from the upper end of the stacked body 2 to the base unit 1. A plate-shaped portion 3 is provided in the deep slit ST (FIG. 1B). The plate-shaped portion 3 contains, for example, at least an insulator. This insulator may be, for example, a silicon oxide. The plate-shaped portion 3 may contain a conductor electrically connected to the embedded source layer BSL while being electrically insulated from the stacked body 2 by the insulator. The shallow slit SHE extends in the X direction, and is provided from the upper end of the stacked body 2 to the middle of the stacked body 2. For example, a plate-shaped portion 4 is provided in the shallow slit SHE (FIG. 1B). The plate-shaped portion 4 may be, for example, silicon oxide.

As illustrated in FIG. 1B, the stacked body 2 includes a stepped portion 2s and the memory cell array 2m. The stepped portion 2s is provided at the edge portion of the stacked body 2. The memory cell array 2m is sandwiched or surrounded by the stepped portion 2s. The deep slit ST is provided from the stepped portion 2s at one end of the stacked body 2 to the stepped portion 2s at the other end of the stacked body 2 by way of the memory cell array 2m. The shallow slit SHE is provided at least in the memory cell array 2m.

As illustrated in FIG. 3, the memory cell array 2m includes a cell region Cell and a tap region Tap. The stepped portion 2s includes a stepped region Staircase (FIG. 3). The tap region is provided, for example, between the cell region and the stepped region. Although not illustrated in FIG. 3, the tap region may be provided between cell regions. The stepped region is a region where a plurality of wirings 37a are provided. The tap region is a region where wirings 37b and 37c are provided. Each of the wirings 37a to 37c extends in, for example, the Z direction. Each of the wirings 37a is electrically connected to, for example, the electrode film 21. The wiring 37b is electrically connected to, for example, the conductive layer 12. The wiring 37c is electrically connected to, for example, the wiring 11a.

A portion of the stacked body 2 sandwiched between two plate-shaped portions 3 illustrated in FIG. 1B is called a block BLOCK. The block constitutes, for example, the smallest unit of data erasure. The plate-shaped portion 4 is provided in the block. The stacked body 2 between the plate-shaped portion 3 and the plate-shaped portion 4 is called a finger. The drain-side select gate SGD is partitioned for each finger. Therefore, at the time of data writing and reading, one finger in the block may be selected by the drain-side select gate SGD.

Each of the plurality of columnar portions CL is provided in a memory hole MH provided in the stacked body 2. Each columnar portion CL penetrates the stacked body 2 from the upper end of the stacked body 2 along the Z direction and extend in the stacked body 2 and the embedded source layer BSL. Each of the plurality of columnar portions CL includes a semiconductor body 210, a memory film 220, and a core layer 230. The columnar portion CL includes the core layer 230 provided at the center thereof, the semiconductor body 210 provided around that core layer 230, and the memory film 220 provided around the semiconductor body 210. The semiconductor body 210 is electrically connected to the embedded source layer BSL. The memory film 220 has a charge trapping portion between the semiconductor body 210 and the electrode film 21. The plurality of columnar portions CL selected one by one from each finger are commonly connected to one bit line BL via the contact Cb. Each of the columnar portions CL is provided in, for example, the cell region Cell (FIG. 3).

As illustrated in FIGS. 2A and 2B, the shape of the memory hole MH in the XY plane is, for example, a circle or an ellipse. A block insulating film 21a constituting a portion of the memory film 220 may be provided between the electrode film 21 and the insulating layer 22. The block insulating film 21a is, for example, a silicon oxide film or a metal oxide film. One example of a metal oxide is an aluminum oxide. A barrier film 21b may be provided between the electrode film 21 and the insulating layer 22 and between the electrode film 21 and the memory film 220. For example, when the electrode film 21 is tungsten, a stacked structure film of, for example, titanium nitride and titanium is selected as the barrier film 21b. The block insulating film 21a prevents back tunneling of charges from the electrode film 21 to the memory film 220 side. The barrier film 21b improves the adhesion between the electrode film 21 and the block insulating film 21a.

The shape of the semiconductor body 210 is, for example, a tubular shape having a bottom. The semiconductor body 210 contains, for example, silicon. Silicon is, for example, polysilicon obtained by crystallizing amorphous silicon. The semiconductor body 210 is, for example, undoped silicon. Further, the semiconductor body 210 may be p type silicon. The semiconductor body 210 serves as a channel for each of the drain-side select transistor STD, the memory cell MC, and the source-side select transistor STS. The semiconductor body 210 is electrically connected to the embedded source layer BSL.

A portion of the memory film 220 other than the block insulating film 21a is provided between the inner wall of the memory hole MH and the semiconductor body 210. The shape of the memory film 220 may be, for example, a tubular shape. The plurality of memory cells MC have a storage region between the semiconductor body 210 and the electrode film 21 serving as the word line WL, and are stacked in the Z direction. The memory film 220 includes, for example, a cover insulating film 221, a charge trapping film 222, and a tunnel insulating film 223. Each of the semiconductor body 210, the charge trapping film 222, and the tunnel insulating film 223 extends in the Z direction.

The cover insulating film 221 is provided between the insulating layer 22 and the charge trapping film 222. The cover insulating film 221 contains, for example, a silicon oxide. The cover insulating film 221 protects the charge trapping film 222 from being etched when a sacrificial film (not illustrated) is replaced with the electrode film 21 (replacement step). The cover insulating film 221 may be removed from between the electrode film 21 and the memory film 220 in the replacement step. In this case, as illustrated in FIGS. 2A and 2B, for example, the block insulating film 21a is provided between the electrode film 21 and the charge trapping film 222. Further, when the replacement step is not used for forming the electrode film 21, the cover insulating film 221 may be omitted.

The charge trapping film 222 is provided between the block insulating film 21a or the cover insulating film 221 and the tunnel insulating film 223. The charge trapping film 222 contains, for example, a silicon nitride and has a trap site where charges are trapped therein. A portion of the charge trapping film 222 sandwiched between the electrode film 21 serving as the word line WL and the semiconductor body 210 is a charge trap and constitutes a storage region of the memory cell MC. The threshold voltage of the memory cell MC changes depending on the presence or absence of charges in the charge trap or the amount of charges trapped in the charge trap. Thus, the memory cell MC stores information.

The tunnel insulating film 223 is provided between the semiconductor body 210 and the charge trapping film 222. The tunnel insulating film 223 contains, for example, silicon oxide, or silicon oxide and silicon nitride. The tunnel insulating film 223 is a potential barrier between the semiconductor body 210 and the charge trapping film 222. For example, when electrons are injected from the semiconductor body 210 into the charge trap (writing operation) and when holes are injected from the semiconductor body 210 into the charge trap (erasing operation), the electrons and holes respectively pass through the potential barrier of the membrane 223 (tunneling).

The core layer 230 is embedded in the internal space of the tubular semiconductor body 210. The shape of the core layer 230 is, for example, a columnar shape. The core layer 230 contains, for example, a silicon oxide and is insulating.

Each of a plurality of columnar portions CLHR of FIG. 3 is provided in a hole HR provided in the stacked body 2. The hole HR penetrates the stacked body 2 from the upper end of the stacked body 2 along the Z direction and extend in the stacked body 2 and the semiconductor portion 13. Each of the columnar portions CLHRs includes at least an insulator 5. The insulator 5 is, for example, silicon oxide. Further, each of the columnar portions CLHR may have the same structure as the columnar portion CL. Each of the columnar portions CLHR is provided in, for example, the stepped region Staircase and the tap region Tap. The columnar portions CLHR function as a support member that holds voids formed in the stepped region and the tap region when replacing a sacrificial film (not illustrated) with the electrode film 21 (replacement step). A plurality of columnar portions CLC4 are formed in the tap region Tap, the insulating film 32, and the insulating film 31 of the stacked body 2. Each of the columnar portions CLC4 includes the wiring 37c. The wiring 37c is electrically insulated from the stacked body 2 by an insulator 36c. The wiring 37c is electrically connected to any of the wiring 11a and the like.

The columnar portions CL, i.e., the memory holes MH are arranged in a hexagonal close-packed arrangement between two slits ST adjacent to each other in the Y direction in a planar layout. As illustrated in FIG. 3, the shallow slit SHE overlaps the partial columnar portion CL. The columnar portion CL under the shallow slit SHE does not constitute the memory cell.

The semiconductor portion 13 of FIG. 1A includes, for example, an n type semiconductor layer 131, an n type semiconductor layer 132, and an n type or undoped semiconductor layer 133. The semiconductor layer 131 is in contact with the conductive layer 12. The semiconductor layer 132 is in contact with each of the semiconductor layer 131 and the semiconductor body 210. For example, the semiconductor layer 132 extends to the portion from which the memory film 220 was removed, and is in contact with the semiconductor body 210. Further, the semiconductor layer 132 surrounds the semiconductor body 210 in the XY plane. The semiconductor layer 133 is in contact with the semiconductor layer 132.

The semiconductor storage device 100a further includes a semiconductor portion 14. The semiconductor portion 14 is located between the stacked body 2 and the semiconductor portion 13. The semiconductor portion 14 includes a semiconductor layer 134. The semiconductor layer 134 is provided between an insulating layer 22b closest to the semiconductor portion 13 among the insulating layers 22 and the insulating film 2g. The conductivity type of the semiconductor layer 134 is, for example, an n type. The semiconductor layer 134 functions as, for example, the source-side select gate SGS.

Figure 4:
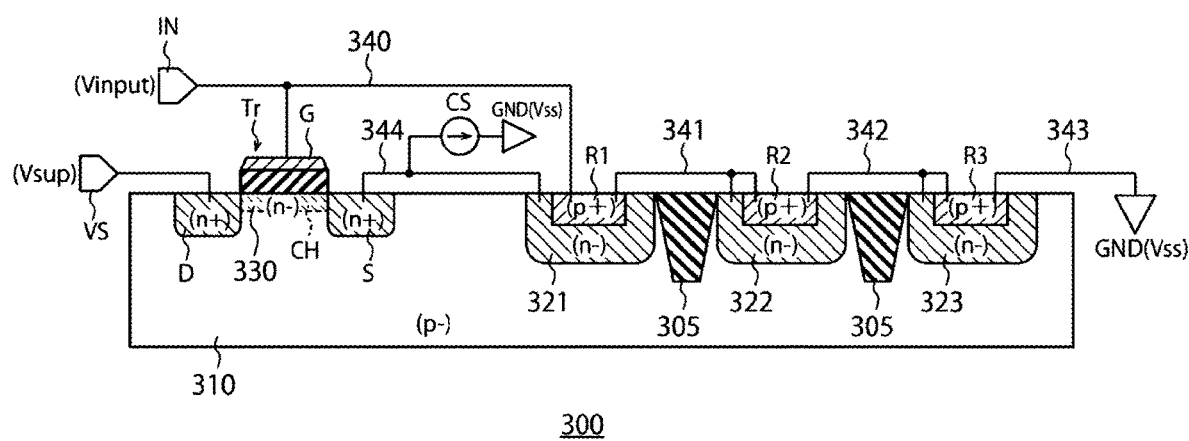
FIG. 4 is a cross-sectional view illustrating a part of a CMOS circuit provided under a memory cell array.
Figure 5:
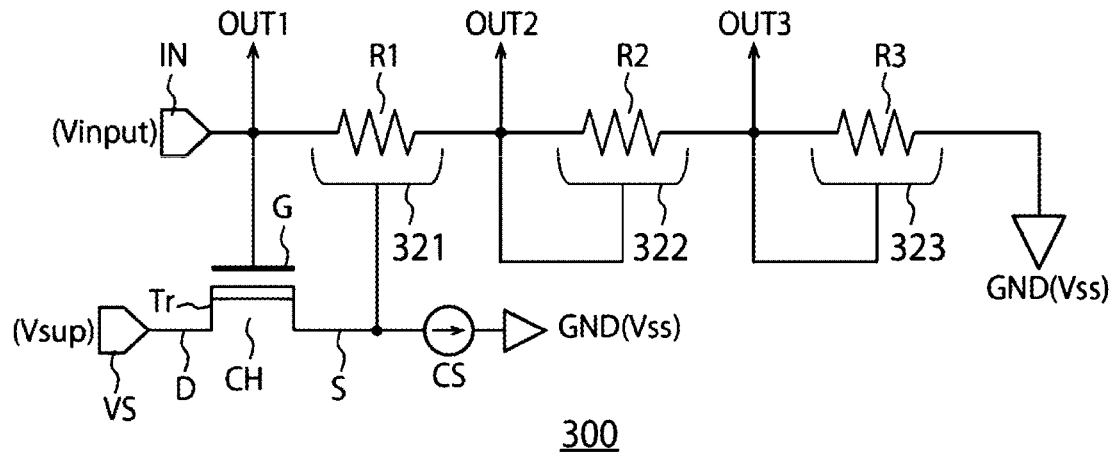
FIG. 5 is an equivalent circuit diagram of a resistance voltage divider circuit illustrated in FIG. 4.

FIG. 4 is a cross-sectional view illustrating a part of a CMOS circuit provided under the memory cell array 2m. FIG. 4 illustrates an example of a resistance voltage divider circuit 300 used for a power supply. FIG. 5 is an equivalent circuit diagram of the resistance voltage divider circuit 300 illustrated in FIG. 4.

The resistance voltage divider circuit 300 has a semiconductor substrate 310, an STI 305, a plurality of well diffusion layers 321 to 323, a plurality of resistance elements R1 to R3, the transistor Tr, a current source CS, and wiring layers 340 to 344.

For the semiconductor substrate 310, for example, a silicon substrate of a p⁻ type as a first conductivity type is used. The surface region of the semiconductor substrate 310 is provided with the shallow trench isolation (STI) 305 as a device isolating region, and the STI 305 defines the other region as an active area. For the STI 305, for example, an insulating film such as a silicon oxide film is used.

The n⁻ type well diffusion layers 321 to 323 are provided as a second conductivity type first impurity diffusion layer in the active area of the surface region of the semiconductor substrate 310. The plurality of well diffusion layers 321 to 323 are formed by introducing, for example, n type impurities such as arsenic and phosphorus into the surface region of the semiconductor substrate 310. Moreover, "−" of n⁻ and p⁻ indicates a relatively low impurity concentration, and "+" of n⁺ and p⁺ indicates a relatively high impurity concentration.

The resistance elements R1 to R3 are configured with a p⁺ type impurity diffusion layer as a first conductivity type second impurity diffusion layer. The resistance elements R1 to R3 are provided corresponding to the well diffusion layers 321 to 323, respectively. The resistance elements R1 to R3 are provided in the respective well diffusion layers 321 to 323 in the surface region of the semiconductor substrate 310. Thus, the respective resistance elements R1 to R3 are provided therearound with the well diffusion layers 321 to 323, and the well diffusion layers 321 to 323 are interposed between the resistance elements R1 to R3 and the semiconductor substrate 310. The resistance elements R1 to R3 are formed by introducing, for example, a p type impurity such as boron into the surface region of the semiconductor substrate 310.

The plurality of resistance elements R1 to R3 are connected in series between an input portion IN and a ground GND as a low voltage source via the wiring layers 341 to 343 to constitute a chain resistor. The number of resistance elements R1 to R3 connected in series may be freely selected. The potential of the ground GND is, for example, Vss.

The wiring layers 340 to 344, which are schematically illustrated in FIG. 4, are configured with a multilayer wiring layer provided on the semiconductor substrate 310. For the plurality of wiring layers of the multilayer wiring layer, for example, a conductive metal such as copper is used. An interlayer insulating film such as a silicon oxide film is provided between the wiring layers of the multilayer wiring layer.

The resistance element R1 is provided in the well diffusion layer 321, and one end thereof is connected to the input portion IN and a gate electrode G of the transistor Tr. The other end of the resistance element R1 is connected to one end of the resistance element R2 and the well diffusion layer 322 via the wiring layer 341.

The resistance element R2 is provided in the well diffusion layer 322, and one end thereof is connected to the other end of the resistance element R1 and the well diffusion layer 322. The other end of the resistance element R2 is connected to one end of the resistance element R3 and the well diffusion layer 323 via the wiring layer 342.

The resistance element R3 is provided in the well diffusion layer 323, and one end thereof is connected to the other end of the resistance element R2 and the well diffusion layer 323. The other end of the resistance element R3 is connected to the ground GND via the wiring layer 343.

The transistor Tr is, for example, an n type metal oxide semiconductor field effect transistor (MOSFET). Further, the transistor Tr is a depression type transistor, and the threshold voltage thereof is a negative value. For example, the threshold voltage of the transistor Tr is assumed to be −Vt. For example, an n type impurity is introduced into a channel region CH of the transistor Tr. The impurity may be introduced into the gate electrode G to make the transistor Tr the depression type.

The gate electrode G of the transistor Tr is connected to the input portion IN and one end of the resistance element R1 via the wiring layer 340. A drain D of the transistor Tr is an n⁺ type impurity diffusion layer, and is connected to a voltage source VS. A source S of the transistor Tr is an n⁺ type impurity diffusion layer, and is connected to the constant current source CS and the well diffusion layer 321 via the wiring layer 344. The constant current source CS is connected between the source S of the transistor Tr and the ground GND. The constant current source CS causes a predetermined current to flow from the transistor Tr to the ground GND.

As illustrated in FIG. 5, the resistance elements R1 to R3 connected in series are used to divide a voltage Vinput of the input portion IN to generate a required voltage. For example, the voltage Vinput is used as an output OUT1. Anode voltage between the resistance element R1 and the resistance element R2 is used as an output OUT2. A node voltage between the resistance element R2 and the resistance element R3 is used as an output OUT3.

At this time, the transistor Tr functions as a source follower circuit. The voltage of the source S is changed to follow the voltage Vinput of the input portion IN of the gate electrode G. When the voltage of the gate electrode G of the transistor Tr is Vinput, the voltage of the source S of the transistor Tr is Vinput+|Vt|. That is, since the transistor Tr is a depression type transistor and the threshold voltage thereof is a negative value, Vinput+|Vt| may be applied to the well diffusion layer 321 around the resistance element R1. Thus, a bias voltage (Vinput+|Vt|) higher than the voltage Vinput of the input portion IN by the absolute value of the threshold voltage is applied to the well diffusion layer 321. In this way, the transistor Tr functions as a bias circuit that applies the bias voltage (Vinput+|Vt|) to the well diffusion layer 321. Meanwhile, the voltage Vinput of the input portion IN is applied to one end of the resistance element R1 via the wiring layer 340. Thus, by providing the transistor Tr, the voltage (Vinput+Vt) of the well diffusion layer 321 is maintained at a voltage higher than the voltage Vinput applied to the resistance element R1 by the absolute value |Vt| of the threshold voltage of the transistor Tr. Thus, a reverse bias is applied and no forward bias is applied to a pn junction between the n⁻ type well diffusion layer 321 and the p+ type resistance element R1. Thus, the leakage current from the resistance element R1 to the well diffusion layer 321 may be prevented, and the current from the input portion IN may flow to the resistance element R2 through the resistance element R1 and the wiring layer 341. As a result, the resistance element R1 may sufficiently function as a voltage divider resistance element.

For example, even when the voltage Vinput of the input portion IN decreases sharply from 9 volts to 3 volts, the voltage of the well diffusion layer 321 changes from (9+Vt) volts to (3+Vt) volts to follow the voltage Vinput. Thus, the voltage of the well diffusion layer 321 is maintained higher than the voltage of the resistance element R1 by |Vt|. In this way, even if the voltage Vinput of the input portion IN decreases sharply, no forward bias is applied to the pn junction between the well diffusion layer 321 and the resistance element R1. Thus, the leakage current from the resistance element R1 to the well diffusion layer 321 may be prevented, and the resistance element R1 may sufficiently function as a voltage divider resistance element, which results in an improvement in the reliability of the semiconductor storage device 100a.

In the first embodiment, the transistor Tr is connected only to the well diffusion layer 321 corresponding to the resistance element R1 connected to the input portion IN (closest to the input portion IN) to apply the bias voltage (Vinput+ |Vt|). No bias circuit (transistor) is provided in the well diffusion layers 322 and 323. This is because the resistance element R1 among the resistance elements R1 to R3 receives the largest voltage change (e.g., V1-V2) from the input portion IN. Since divided voltages (OUT2 and OUT3) are applied to the resistance elements R2 and R3, a voltage change at one end of the resistance elements R2 and R3 on the input side is less than a voltage change at one end of the resistance element R1 on the input side.

Generally, the accuracy of the divided voltage is important in analog circuit. The accuracy of the divided voltage is decided by whether the resistance ratio is an ideal value (desired value) or not. In order to make the resistance ratio into a desired value, it is necessary to suppress voltage dependency so that the resistance ratio may not change on any voltage. Therefore, when the resistance voltage divider circuit 300 is used in an analog circuit, the resistance ratio of the resistance elements R1 to R3 may become important. In this case, it is necessary to prevent the voltage dependence of the resistance values of the resistance elements R1 to R3. The voltage dependence of the resistance depends on the magnitude of a reverse bias voltage applied to the pn junction between the n− type well diffusion layer 321 and the p+ type resistance element R1. When the reverse bias voltage is applied to the pn junction, a depletion layer is created at the pn junction. The resistance values of the resistance elements R1 to R3 increase by the amount of the depletion layer spreading over the p+ type resistance elements R1 to R3 and narrower the p+ type resistance elements R1 to R3. Thus, it is desirable not only to prevent the leakage current but also to prevent a change in the resistance values of the resistance elements R1 to R3 due to the reverse bias voltage.

Therefore, in at least one embodiment, the voltage of the well diffusion layers 321 to 323, which is applied the voltage Vt is raised by the absolute value |Vt| of the threshold voltage rather than the voltage Vinput. Thus, while avoiding the forward bias state at the pn junction, the minimum necessary reverse bias voltage is applied to the pn junction, which also prevents a change in the resistance of the resistance elements R1 to R3. That is, the resistance values of the resistance elements R1 to R3 do not change much depending on a change in the voltage Vinput. Thus, the resistance voltage divider circuit 300 according to at least one embodiment is also advantageous in an analog circuit.

Figure 6A:
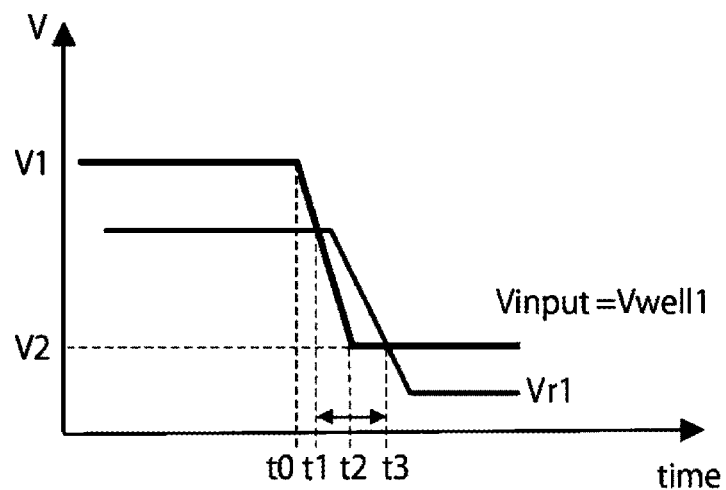
FIG. 6A is a graph illustrating an operation of a resistance voltage divider circuit without a transistor Tr.

FIG. 6A is a graph illustrating an operation of a resistance voltage divider circuit without the transistor Tr. The vertical axis represents the voltage Vinput, the voltage Vwell1 of the well diffusion layer 321, or the voltage Vr1 it designates a voltage of a position inside of the resistance element R1. The horizontal axis represents time.

As illustrated in FIG. 6A, when no transistor Tr is provided, i.e., when no source follower circuit is provided, the well diffusion layer 321 is connected to the input portion IN. Thus, the voltage Vwell1 of the well diffusion layer 321 is substantially equal to the voltage Vinput of the input portion IN. In this case, when the voltage Vinput decreases from V1 to V2 (V2<V1) (t0 to t2), the voltage Vwell1 of the well diffusion layer 321 decreases from V1 to V2 together with the voltage Vinput of the input portion IN. At this time, the voltage Vr1 of the resistance element R1 starts to decrease with a delay which occurs by the resistance and parasitic capacitance, from the time t0 when the voltage Vinput of the input portion IN starts to decrease. Thus, as illustrated in the period from t1 to t3, the voltage Vr1 of the resistance element R1 may be larger than the voltage Vinput, i.e., the voltage Vwell1 of the well diffusion layer 321. In this case, a forward bias is applied to the pn junction between the well diffusion layer 321 and the resistance element R1, and the leakage current flows from the resistance element R1 to the well diffusion layer 321. Moreover, whether or not the forward bias is applied to the pn junction between the well diffusion layer 321 and the resistance element R1 also depends on the slope of a change in the voltage Vinput of the input portion IN or the magnitude of the change in the voltage Vinput.

Figure 6B:
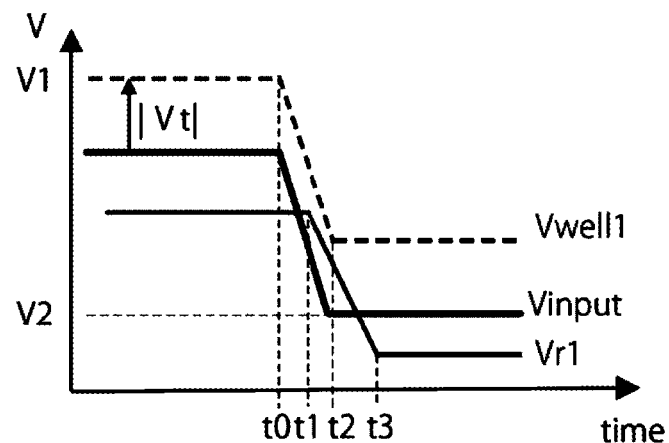
FIG. 6B is a graph illustrating an operation of a resistance voltage divider circuit according to at least one embodiment.

FIG. 6B is a graph illustrating an operation of the resistance voltage divider circuit 300 according to at least one embodiment. In at least one embodiment, as described above, the voltage Vwell1 of the well diffusion layer 321 is set to a voltage (Vinput+|Vt|) higher than the voltage Vinput of the input portion IN by the threshold voltage |Vt| of the transistor Tr due to the function of the source follower circuit of the transistor Tr. Thus, even if the voltage Vinput of the input portion IN decreases from V1 to V2 (t0 to t2), the voltage Vwell1 of the well diffusion layer 321 decreases from the voltage (V1+|Vt|) to V2+|Vt|). In this way, since the voltage Vwell1 of the well diffusion layer 321 is higher than the voltage Vinput of the input portion IN by |Vt|, the voltage Vwell1 is always maintained higher than the voltage Vr1 of the resistance element R1. Thus, no forward bias is applied to the pn junction between the well diffusion layer 321 and the resistance element R1, and it is possible to prevent the leakage current from flowing from the resistance element R1 to the well diffusion layer 321. As a result, the resistance voltage divider circuit 300 according to at least one embodiment may output desired output voltages OUT1 to OUT3 from the resistance elements R1 to R3.

Moreover, when a change in the voltage Vinput is large and the slope of the change is large, the absolute value |Vt| of the threshold voltage of the transistor Tr may be increased correspondingly, so that no forward bias is applied to the pn junction between the well diffusion layer 321 and the resistance element R1.

Second Embodiment

Figure 7:
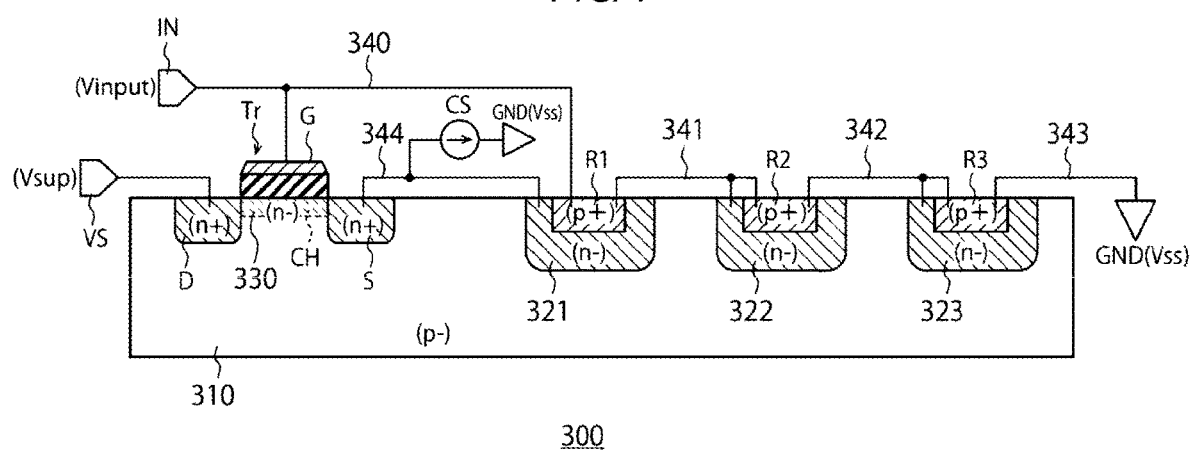
FIG. 7 is a schematic cross-sectional view illustrating a configuration example of a resistance voltage divider circuit according to a second embodiment.

FIG. 7 is a schematic cross-sectional view illustrating a configuration example of the resistance voltage divider circuit 300 according to a second embodiment. According to the second embodiment, the STI305 is omitted.

When the well diffusion layers 321 to 323 are sufficiently electrically separated even if the STI305 is not provided, the STI305 does not need to be provided. Thus, the layout area of the resistance voltage divider circuit 300 may be reduced. Other configurations of the second embodiment may be the same as the corresponding configurations of the first embodiment. Thus, the second embodiment may obtain the same effects as the first embodiment.

Third Embodiment

Figure 8:
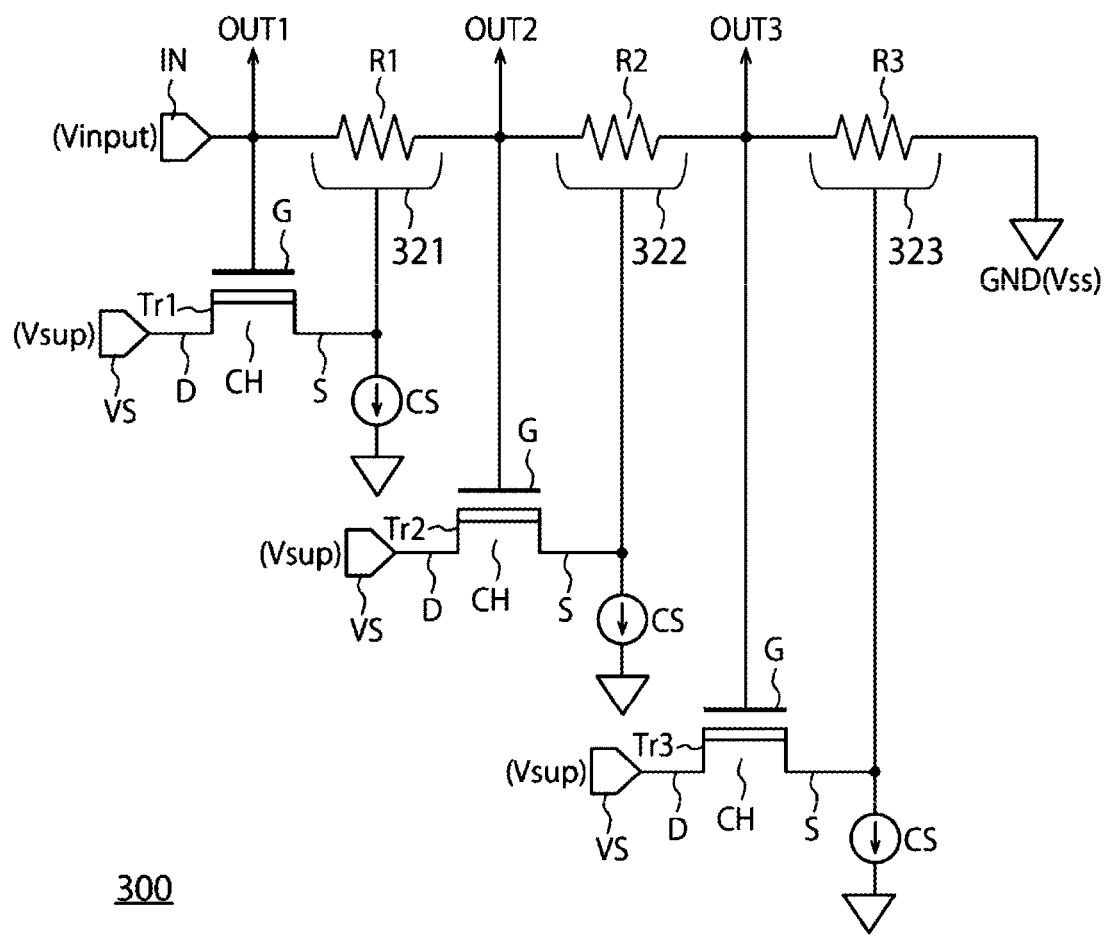
FIG. 8 is a circuit diagram illustrating a configuration example of a resistance voltage divider circuit according to a third embodiment.

FIG. 8 is a schematic cross-sectional view illustrating a configuration example of the resistance voltage divider circuit 300 according to a third embodiment. In the third embodiment, bias circuits (transistors Tr2 and Tr3) are provided not only in the well diffusion layer 321 closest to the input portion IN but also in the well diffusion layers 322 and 323 following the well diffusion layer 321.

Since a transistor Tr1 connected to the well diffusion layer 321 has the same configuration as the transistor Tr of the first embodiment, the description thereof will be omitted.

The gate electrode G of a transistor Tr2 is connected between the resistance element R1 and the resistance element R2. The drain D of the transistor Tr2 is an n+ type impurity diffusion layer, and is connected to the voltage source VS. The source S of the transistor Tr2 is an n+ type impurity diffusion layer, and is connected to the constant current source CS and the well diffusion layer 322.

The transistor Tr2 functions as a source follower circuit. The transistor Tr2 is also a depression type transistor, and the threshold voltage thereof is a negative value. Thus, a bias voltage (voltage of OUT2+|Vt2|) higher than the voltage of OUT2 by the absolute value of the threshold voltage is applied to the well diffusion layer 322 around the resistance element R2. In this way, the transistor Tr2 functions as a bias circuit that applies a bias voltage to the well diffusion layer 322.

Meanwhile, the voltage of OUT2 is applied to one end of the resistance element R2. Thus, by providing the transistor Tr2, the voltage of the well diffusion layer 322 is maintained at the voltage (voltage of OUT 2+|Vt2|) higher than the voltage applied to the resistance element R2 by the absolute value of the threshold voltage of the transistor Tr2. Thus, it is possible to prevent a forward bias from being applied to a pn junction between the well diffusion layer 322 and the resistance element R2. Thus, the leakage current from the resistance element R2 to the well diffusion layer 322 is prevented, and the resistance element R2 may sufficiently function as a voltage divider resistance element.

The gate electrode G of a transistor Tr3 is connected between the resistance element R2 and the resistance element R3. The drain D of the transistor Tr3 is an n+ type impurity diffusion layer, and is connected to the voltage source VS. The source S of the transistor Tr3 is an n+ type impurity diffusion layer, and is connected to the constant current source CS and the well diffusion layer 323.

The transistor Tr3 also functions as a source follower circuit. The transistor Tr3 is also a depression type transistor, and the threshold voltage thereof is a negative value. Thus, a bias voltage (voltage of OUT3+|Vt3|) higher than the voltage of OUT3 by the absolute value of the threshold voltage is applied to the well diffusion layer 323 around the resistance element R3. In this way, the transistor Tr3 functions as a bias circuit that applies a bias voltage to the well diffusion layer 323.

Meanwhile, the voltage of OUT3 is applied to one end of the resistance element R3. Thus, by providing the transistor Tr3, the voltage of the well diffusion layer 323 is maintained at the voltage (voltage of OUT 3+|Vt3|) higher than the voltage applied to the resistance element R3 by the absolute value of the threshold voltage of the transistor Tr3. Thus, it is possible to prevent a forward bias from being applied to a pn junction between the well diffusion layer 323 and the resistance element R3. Thus, the leakage current from the resistance element R3 to the well diffusion layer 323 is prevented, and the resistance element R3 may sufficiently function as a voltage divider resistance element.

The transistors Tr1 to Tr3 may be depression type transistors, and their threshold voltages may be the same or different from each other.

For example, when the voltages of the outputs OUT2 and OUT3 also change significantly with a change in the voltage Vinput of the input portion IN, the third embodiment is effective.

Moreover, when the voltage of the output OUT2 changes significantly with a change in the voltage Vinput of the input portion IN, but the voltage of the output OUT3 does not change so much, the transistor Tr3 may be omitted and only the transistors Tr1 and Tr2 may be provided.

In the above-described embodiments, an n type depression type transistor is used as the transistor Tr. However, when the conductivity type of the semiconductor substrate 310, the well diffusion layers 321 to 323, and the resistance elements R1 to R3 is changed so that a magnitude relationship of the voltages Vinput and Vsup and the voltage of the ground GND is reversed, a p type depression type transistor may be used as the transistor Tr.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a first conductivity type semiconductor substrate;
   a second conductivity type first impurity diffusion layer disposed in a surface region of the semiconductor substrate;
   a first resistance element, including a first conductivity type second impurity diffusion layer and having an input portion, disposed in the second conductivity type first impurity diffusion layer;
   a second resistance element, including a first conductivity type third impurity diffusion layer that is separated from the second conductivity type first impurity diffusion layer;
   a transistor that is out from the second conductivity type first impurity diffusion layer and the first conductivity type third impurity diffusion layer including:
      a gate connected to the input portion,
      a source connected to the second conductivity type first impurity diffusion layer, and
      a drain connected to a voltage source, the voltage source having a voltage higher than a voltage of the input portion; and
      a current source connected to the source, wherein the first resistance element and the second resistance element are in series between the input portion and an output portion, the output portion having a voltage lower than the voltage of the voltage source.

2. The semiconductor device according to claim 1, wherein the transistor includes a field effect transistor.

3. The semiconductor device according to claim 1, wherein the semiconductor device includes a memory device.

4. The semiconductor device according to claim 3, further comprising a stacked body, the stacked body including alternating layers of insulating layers and conducting layers disposed above the transistor.

5. The semiconductor device according to claim 4, wherein the insulating layers contain silicon oxide and conducting layers contain tungsten.

6. The semiconductor device according to claim 1, further including an interlayer insulating film disposed over the transistor and the resistance element.

7. The semiconductor device according to claim 6, wherein the interlayer insulating film contains silicon oxide.

8. The semiconductor device according to claim 6, further including wiring disposed in the interlayer insulating film and electrically connected to the transistor.

9. The semiconductor device according to claim 1, wherein the transistor includes a depression type transistor.

10. The semiconductor device according to claim 9, wherein the transistor has a negative threshold voltage.

11. The semiconductor device according to claim 1, wherein a plurality of the resistance elements are disposed in the surface region of the semiconductor substrate, and
the plurality of resistance elements are connected in series.

12. The semiconductor device according to claim 11, further including shallow trench isolation between the plurality of resistance elements.

13. The semiconductor device according to claim 11, further including a plurality of transistors arranged to respectively bias the plurality of resistance elements.

14. The semiconductor device according to claim 1, wherein the source and the drain of the transistor are of the second conductivity type.

15. The semiconductor device according to claim 1, wherein the second conductivity type first impurity diffusion layer has a voltage higher than the voltage of the input portion by an absolute value of a threshold voltage of the transistor.

* * * * *